US010356940B2

(12) United States Patent
Rowe

(10) Patent No.: US 10,356,940 B2
(45) Date of Patent: Jul. 16, 2019

(54) IN AND RELATING TO ANTENNA SYSTEMS

(71) Applicant: BAE SYSTEMS plc, London (GB)

(72) Inventor: Adrian Thomas Rowe, Cowes (GB)

(73) Assignee: BAE SYSTEMS plc, London (GB)

( * ) Notice: Subject to any disclaimer, the term of this patent is extended or adjusted under 35 U.S.C. 154(b) by 328 days.

(21) Appl. No.: 14/894,793

(22) PCT Filed: May 30, 2014

(86) PCT No.: PCT/GB2014/051650
§ 371 (c)(1),
(2) Date: Nov. 30, 2015

(87) PCT Pub. No.: WO2014/191756
PCT Pub. Date: Dec. 4, 2014

(65) Prior Publication Data
US 2016/0113146 A1 Apr. 21, 2016

(30) Foreign Application Priority Data

May 31, 2013 (EP) .................................... 13275129
May 31, 2013 (GB) .................................... 1309742.3

(51) Int. Cl.
H05K 7/20 (2006.01)
H01Q 1/02 (2006.01)
H01Q 21/00 (2006.01)

(52) U.S. Cl.
CPC ........... *H05K 7/20136* (2013.01); *H01Q 1/02* (2013.01); *H01Q 21/00* (2013.01); *H05K 7/20154* (2013.01)

(58) Field of Classification Search
CPC .. H05K 7/20136; H05K 7/20154; H01Q 1/02; H01Q 21/00
See application file for complete search history.

(56) References Cited

U.S. PATENT DOCUMENTS 5,099,254 A * 3/1992 Tsukii ................ H01Q 21/0025
333/247
6,269,864 B1 8/2001 Kabadi
(Continued)

FOREIGN PATENT DOCUMENTS

GB 1341294 12/1973
JP 2001217728 A 8/2001
(Continued)

OTHER PUBLICATIONS

International Search Report and Written Opinion received for Patent Application No. PCT/GB2014/051650, dated Jul. 28, 2014. 15 pages.
(Continued)

*Primary Examiner* — James Wu
*Assistant Examiner* — Michael A Matey
(74) *Attorney, Agent, or Firm* — Finch & Maloney PLLC

(57) ABSTRACT

An air-cooled antenna comprising one or more separate antenna arrays (4) and a plurality of separate respective radio transmitter and/or receiver modules (3) each adapted for generating and/or receiving radio-frequency (RF) transmissions for an antenna array associated therewith. An antenna housing (2) contains the transmitter and/or receiver modules and has a ventilation inlet (8) for receiving air into the housing to an exhaust outlet (9) for outputting the air from the housing. A ventilation driver (6) drives an air flow rate through the housing from the ventilation inlet to the exhaust outlet. Neighboring transmitter and/or receiver modules are arranged to present opposing respective surfaces (10) across a spacing therebetween to define a ventilation gap populated by a plurality of separate heat-conductive projections (30) which extend in a direction across the ventilation gap and which are spaced to generate turbulence
(Continued)

in a flow air along the ventilation gap at the flow rate determined by the ventilation driver.

17 Claims, 4 Drawing Sheets

(56) References Cited

U.S. PATENT DOCUMENTS

| | | | |
|---|---|---|---|
| 6,469,671 B1* | 10/2002 | Pluymers | G01S 7/032 |
| | | | 343/700 MS |
| 6,496,158 B1* | 12/2002 | Ksienski | H01Q 3/36 |
| | | | 342/374 |
| 6,729,383 B1 | 5/2004 | Cannell et al. | |
| 7,146,069 B1* | 12/2006 | Bowers | G02B 6/2861 |
| | | | 385/18 |
| 2006/0231236 A1 | 10/2006 | Spokoiny et al. | |
| 2009/0084527 A1* | 4/2009 | Rummel | H01Q 1/02 |
| | | | 165/104.31 |
| 2009/0190302 A1 | 7/2009 | Bhattacharya et al. | |
| 2009/0290305 A1 | 11/2009 | Yang et al. | |
| 2010/0157531 A1 | 6/2010 | Mason et al. | |
| 2011/0007476 A1 | 1/2011 | Joshi et al. | |
| 2011/0241932 A1* | 10/2011 | Rowe | H05K 7/20563 |
| | | | 342/175 |
| 2012/0033383 A1* | 2/2012 | Jones | H01Q 1/02 |
| | | | 361/701 |
| 2012/0218149 A1* | 8/2012 | Edward | H01Q 21/0025 |
| | | | 342/368 |
| 2013/0223012 A1* | 8/2013 | Pierides | B23P 15/26 |
| | | | 361/704 |
| 2013/0321239 A1* | 12/2013 | Bingham | H01Q 1/24 |
| | | | 343/879 |

FOREIGN PATENT DOCUMENTS

| | | |
|---|---|---|
| JP | 2002185173 A | 6/2002 |
| JP | 2007142074 A | 6/2007 |
| JP | 2012174779 A | 9/2012 |
| WO | 9102207 | 2/1991 |
| WO | 2014191756 A1 | 12/2014 |

OTHER PUBLICATIONS

GB Intellectual Property Office Search Report under Section 17(5) received for GB Patent Application No. 1309742.3 dated Aug. 22, 2013. 4 pages.

Extended European Search Report received for EP Patent Application No. 13275129.8 dated Oct. 15, 2013. 12 pages.

International Preliminary Report on Patentability received for Patent Application No. PCT/GB2014/051650, dated Dec. 10, 2015. 11 pages.

* cited by examiner

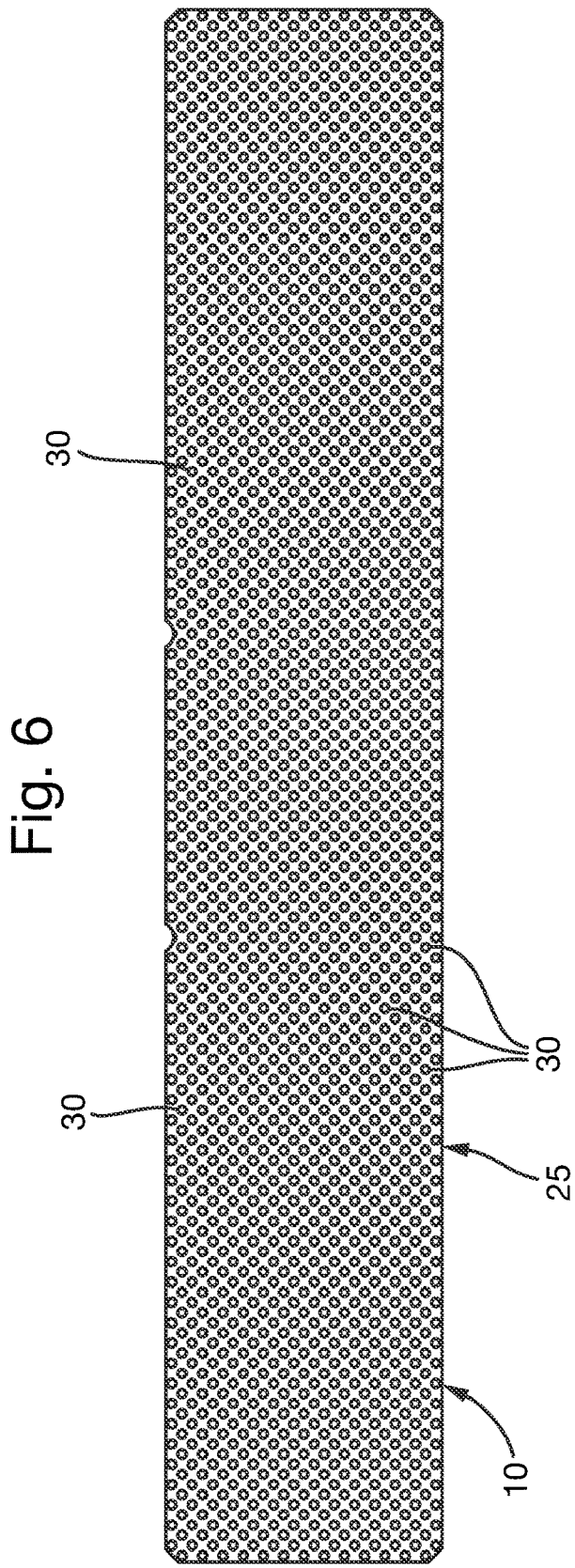

IN AND RELATING TO ANTENNA SYSTEMS

FIELD OF THE INVENTION

The invention relates to antenna systems and particularly, though not exclusively, to reconfigurable radar antenna systems.

BACKGROUND

Transmitter and receiver units employed in radar antenna systems, as well as the antenna radiating elements and transmission lines of such systems, are prone to generating heat in use. It is desirable to remove this heat to protect the electronic components within the transmitter and receiver units and to control the temperature to be conducive to optimal operation of the system.

Traditionally, the cooling of antenna systems has been done using a liquid coolant such as oil or water. This requires the circulation of large quantities of liquid coolant around the components of the antenna system being cooled. The energy required to achieve the mass flow rates of coolant necessary for suitable heat exchange may be undesirably high, especially when the antenna system is mounted high on an antenna mast and is required to be pumped vertically to the antenna in question. Alternatively, the coolant fluid as a whole may be arranged in close proximity to the antenna system it cools, but this then adds a significant amount of weight to the antenna system which is undesirable in a mast-mounted antenna system where weight and size are preferably to be minimised.

The invention aims to provide an improved antenna system with temperature control.

SUMMARY OF THE INVENTION

At its most general, the invention is a gas-cooled (e.g. air-cooled) antenna system in which the coolant gas flow between, within and/or through parts of the system being cooled by the gas, is controlled to cause it to become turbulent to enhance the transfer of heat to the coolant gas. The control of the gas flow may be achieved by a combination of a control of the volumetric flow rate of coolant gas and the provision of optimally shaped and dimensioned heat exchanger elements within the coolant gas flow path to control the nature (e.g. degree of turbulence) of that flow and heat transfer rates to the gas.

Preferably, the coolant gas flow is controlled to provide a through-put rate of coolant through the antenna system which is suitably low to optimise the transfer of heat to the coolant gas (and most preferably the flow is directed through heat transfer surfaces which project into the coolant flow), yet of sufficient through-put to remove heated coolant gas from the antenna system and admit fresh coolant gas therein for the cooling process.

Low flow rates are desirable in order to reduce power consumption in air fans or impellers required to drive the cooling process whilst maximising heat transfer to the coolant gas/air. It is desired to avoid, inhibit or minimise laminar flow forming in the gas/air where it is necessary to transfer heat from the components of the antenna system. The invention preferably promotes the generation of sufficient air turbulence where required (as well as desirably providing sufficient surface area for the efficient transfer of heat into the coolant gas/air).

In a first aspect, the invention may provide an air-cooled antenna comprising one or more separate antenna arrays and a plurality of separate respective radio transmitter and/or receiver modules each adapted for generating and/or receiving radio-frequency (RF) transmissions for a said antenna array associated therewith, an antenna housing containing said transmitter and/or receiver modules and having a ventilation inlet for receiving air into the housing to an exhaust outlet for outputting said air from the housing; and, a ventilation driver for driving an air flow rate through the housing from said ventilation inlet to said exhaust outlet. Neighbouring transmitter and/or receiver modules are arranged to present opposing respective surfaces across a spacing therebetween to define a ventilation gap populated by a plurality of separate heat-conductive projections which extend in a direction across the ventilation gap from a said surface and which are spaced to generate turbulence in a flow air along the ventilation gap at said flow rate determined by said ventilation driver.

For example, the transmitter/receiver units may each comprise a generally rectangular box and these may be arranged in a rack, being placed in the rack in closely spaced parallel separation. Upon the flat surface of any one or more transmitter/receiver unit may be mounted a metal sheet from which projects a "forest" of closely-spaced projections such as pins. These projections may extend into the narrow gap between neighbouring transmitter/receiver units.

The spacing between the transmitter/receiver units or modules (TRM) in the rack is preferably chosen to cause the velocity of the air to increase when it enters the gap, being pushed through the antenna housing by the ventilation driver (e.g. a fan, or impeller). The velocity increase promotes turbulence in the forest of pins and this "blows" more effectively upon the hot transmitter/receiver units in the rack to cool them. This is analogous to blowing upon the surface of a hot mug of tea. The turbulence this produces causes enhanced heat transfer to the air.

The spacing preferably does not exceed about 0.05 meters. Preferably, the opposing respective surfaces are substantially flat and mutually parallel such that said spacing is substantially uniform. This general gap geometry typical in many antenna systems, but it should be understood that the gap could be a cooling channel of any geometry with any mixture of extended surface types.

The flow rate is a preferably volumetric flow rate which does not exceed about 1 (one) cubic meters per second. The volumetric flowrate through a ventilation gap formed between two aforesaid TRMs is preferably between about 10 liters per second (L/s) and about 40 L/s, or more preferably between about 15 L/s and about 30 L/s, or yet more preferably between about 20 L/s and about 25 L/s, such as about 23 L/s.

The spacing may be such that the pitch between neighbouring TRM's may be influenced by the radar operating frequencies and the spacing of radiating antenna dipole elements. It may be between about 30 mm and about 70 mm, for example, or preferably between about 40 mm and about 60 mm, such as between about 45 mm and 50 mm (e.g. 48.5 mm). In principle the pitch of the units could be larger or smaller but what is important is the gap that is left between them for the air to pass through and into which are fitted heat-conductive projections (e.g. a heatsink with projecting pins/fins etc). The level of turbulence in air flow is a function of the flow rate and flow area. In effect it is the velocity of the air which principally determines turbulence, and this is controlled by the ratio of inertia and viscous forces in the fluid. As a result, if a ventilation gap is relatively large then the flow rate would desirably be increased to maintain a Reynolds Number at the same level. The ventilation driver may be controlled to achieve that as design requirements dictate. Similarly, a change in the number of heat-conductive projections (e.g. heatsink fins or pins) and/or their spacing and width/diameter would also have an effect on the Reynolds Number. A further factors in heat transfer is the surface area through, or from which heat is transferred. The Reynolds Number of a fluid is used as a measure for whether or not the fluid flow is laminar or turbulent and, from a heat transfer perspective, the inventors have realised that turbulent flow is preferable because the flowing fluid then consists of relatively large scale eddys whereas, for laminar flow, the fluid is smooth and there is no 'scrubbing' of the surface. The Reynolds Number at which turbulence occurs depends on geometrical factors such as duct/conduit/pipe diameter, the diameter/width of heat-conductive projections The heat-conductive projections may extend a distance not exceeding about 0.05 meters in said direction across the ventilation gap from a said surface.

Neighbouring said heat-conductive projections may be separated by a spacing not exceeding about 0.05 meters.

Neighbouring said heat-conductive projections may have a width not exceeding about 0.05 meters. In preferred embodiments, the diameter of each projection is about 2 mm, each is about 6 mm high/long, and each is spaced from its neighbour projection by about 2 mm (e.g. the pitch between projections may be 4 mm with the gap between them of 2 mm). The projections may be substantially identical. The projections are preferably uniformly spaced in a regular array. The projections may project in a direction parallel to each other. The projections may be cylindrical pins, or rectangular strips or fins, or may be elliptical, oval or tear-drop shaped in cross section.

Preferably, the exhaust outlet is open to the external environment to define an open loop air cooling system. Alternatively, the exhaust outlet may be arranged in fluid communication with (e.g. part of) a closed air circulation loop such that heated, output air may be returned to a cooling unit if necessary within the closed loop system.

In a second aspect, the invention may provide a method of air-cooling an antenna comprising providing one or more separate antenna arrays and a plurality of separate respective radio transmitter and/or receiver modules each adapted for generating and/or receiving radio-frequency (RF) transmissions for a said antenna array associated therewith, providing an antenna housing containing said transmitter and/or receiver modules and having a ventilation inlet for receiving air into the housing to an exhaust outlet for outputting said air from the housing. Neighbouring transmitter and/or receiver modules are arranged to present opposing respective surfaces across a spacing therebetween to define a ventilation gap. The method includes populating the ventilation gap with a plurality of separate heat-conductive projections which extend in a direction across the ventilation gap from a said surface, and driving an air flow through the housing from said ventilation inlet to said exhaust outlet at a flow rate to generate turbulence in the air flow along the ventilation gap between said separate heat-conductive projections thereby to transfer heat from a said surface.

The flow rate is preferably a volumetric flow rate which does not exceed about 1 (one) cubic meters per second.

BRIEF DESCRIPTION OF THE DRAWINGS

FIG. 6 shows a plan view of a heat exchanger unit according to the invention.

DETAILED DESCRIPTION

Figure 1:
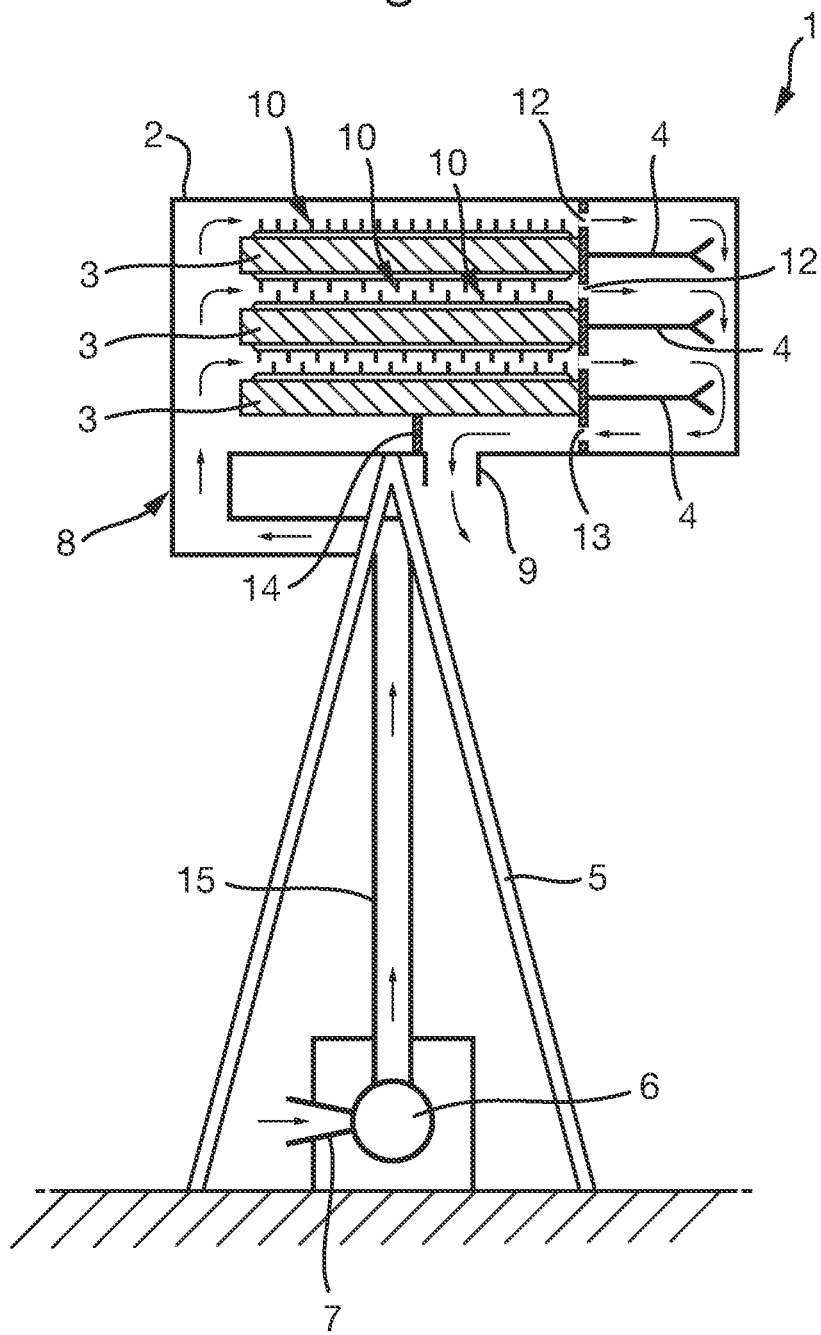
FIG. 1 schematically illustrates an air-cooled RADAR antenna system mounted at the top of a mast according to an embodiment of the invention.

In the drawings, like items are assigned like reference symbols.

FIG. 1 illustrates an air-cooled RADAR antenna system 1 mounted at the top of a mast 5 according to an embodiment of the invention. The antenna system comprises an antenna housing 2 containing three separate antenna arrays 4 each connected to a respective one of three separate transmitter/receiver modules (TRM) 3 each arranged for generating radio-frequency electromagnetic signals, for providing those signals to a respective antenna array connected to it for radio transmission therefrom, and for receiving return radio signals from the respective antenna array for output to, and processing by, a RADAR control system (not shown).

The antenna system includes a ventilation driver 6 in the form of a ventilation fan arranged at the foot of the mast 5 to reduce the load at the top of the mast. The ventilation driver is arranged to draw in ambient air through an air intake duct 7 thereof, and to drive the air upwards along a ventilation supply duct 15 to a ventilation inlet opening 8 formed in the housing 2 of the antenna system atop the mast. The ventilation driver is controlled to supply air to the housing at a desired volumetric air flow rate of about 0.35 cubic meters per second. The ventilation driver may also include, or be in fluid communication with, a cooling unit (not shown) at the base of the mast comprising a heat exchanger and heaters for either cooling or heating the ambient external air input to the ventilation driver in order that it can deliver it to the antenna at a temperature of about 20 degrees Celsius for temperature control of the antenna.

The ventilation air inlet opening 8 is in fluid communication with a ventilation exhaust outlet 9 formed in a wall of the housing for expelling heated ventilation air out into the local external environment. The ventilation air inlet opening 8 is separated from the ventilation exhaust outlet 9 by a flow guide 14. The ventilation system is an "open" system accordingly.

The separate TRM units 3 and the separate associated antenna arrays 4 are arranged within the housing 2 of the antenna system between the ventilation inlet opening and the ventilation exhaust outlet 9 and form an obstacle to the flow of air between the two. Thus, the interaction of ventilation air flowing over and between TRMs and antenna arrays permits the transfer of heat from the latter to the former for expulsion via the ventilation exhaust outlet.

Figure 2:
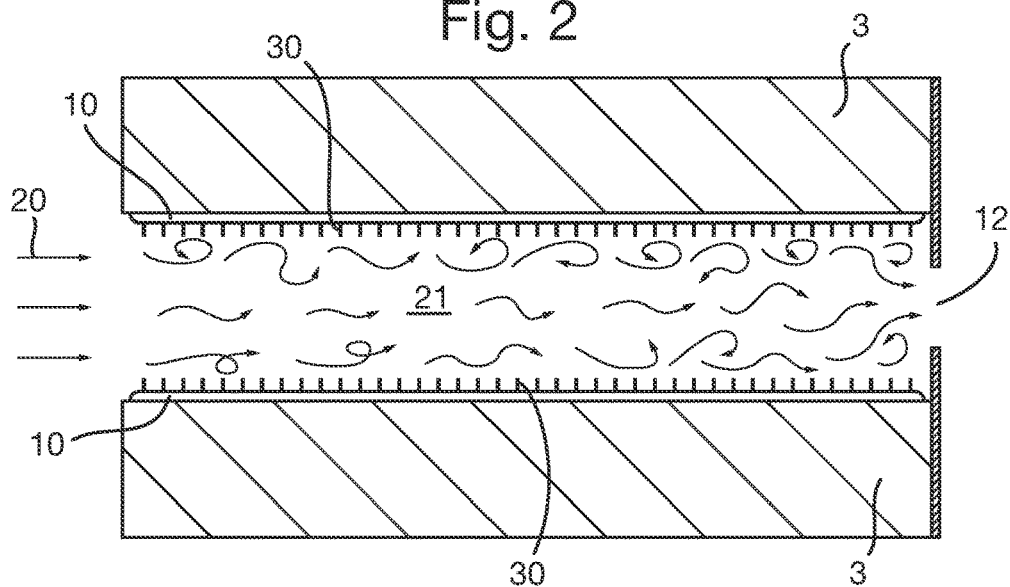
FIG. 2 shows a magnified view of two neighbouring transmit/receive modules (TRM) of the embodiment shown in FIG. 1.
Figure 3:
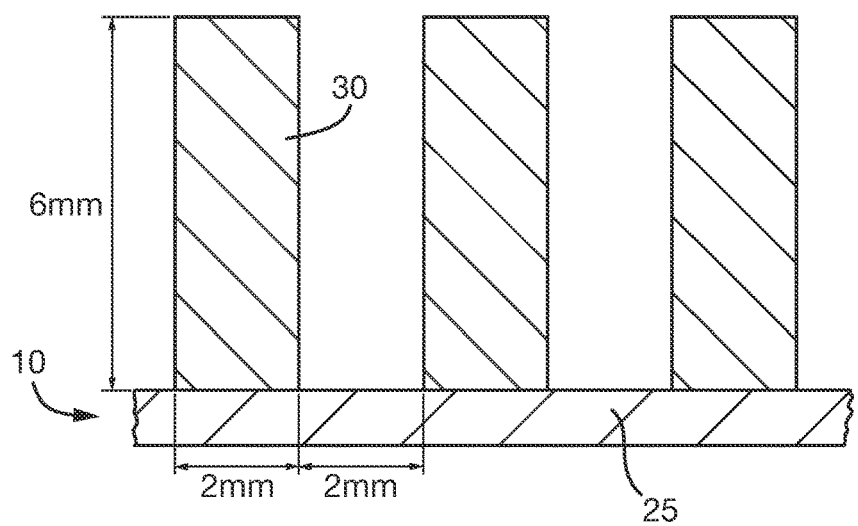
FIG. 3 shows a magnified view of a heat exchanger plate of the embodiment of FIG. 1 comprising upstanding pins.

Referring to FIG. 1 and FIG. 2 together, there is shown, in FIG. 2, a magnified view of two neighbouring TRMs. These neighbouring transmitter/receiver modules each have mounted upon then a substantially planar heat exchanger unit 10 in the form of a plate 25 populated by a plurality of separate heat-conductive projections 30 which extend in a direction across the ventilation gap from a surface of the heat exchanger plate. The projections are each formed as a regular cylindrical pin having a diameter of about 2 mm, being about 6 mm high/long, and each is spaced from its neighbour pin by about 2 mm in pitch. FIG. 3 schematically illustrates this. The pins are substantially identical and uniformly spaced in a regular array. The projections each project in a direction substantially parallel to each other and substantially perpendicular to the plate of the heat exchanger unit. The projections may be rectangular strips or fins, or may be elliptical, oval or tear-drop shaped in cross section in alternative embodiments, or a mixture of these.

Figure 4:
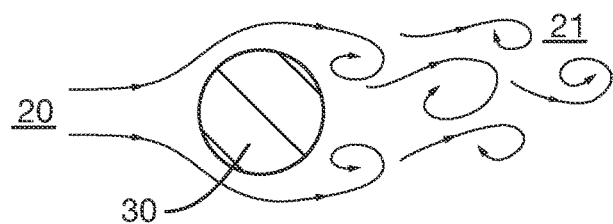
FIG. 4 schematically illustrates the onset of turbulent air flow at a pin of FIG. 3.

This spacing between opposing heat exchanger units, and the arrangement and dimensioning of the pins act in synergy to generate turbulence 21 in a flow air along the ventilation gap at the flow rate controlled and maintained by the ventilation driver. This is shown schematically in FIG. 4 for a single pin 30, but applies equally to each pin. Promotion of turbulent air flow, and suppression of laminar air flow at the heat exchanger units promotes the efficient exchange of heat from the TRM units to the ventilating air.

The plates of opposing respective heat exchanger units are arranged to present respective opposing and substantially plane parallel surfaces (populated by pins) across a substantially uniform spacing formed between them to define a ventilation gap into which ventilation air 20 from the ventilation inlet opening may flow.

For example, the transmitter/receiver units may each comprise a generally rectangular box and these may be arranged in a rack, being placed in the rack in closely spaced parallel separation. Upon the flat surface of any one or more transmitter/receiver unit may be mounted a heat exchanger in the form of a metal sheet from which projects a "forest" of closely-spaced pins. These projections extend into the narrow gap between neighbouring transmitter/receiver units.

The spacing between the transmitter/receiver units in the rack is chosen to cause the velocity of the air to increase when it enters the gap, being pushed through the antenna housing by the ventilation driver. The velocity increase promotes turbulence in the forest of pins and this is effectively "blows" more effectively upon the hot transmitter/receiver units in the rack to cool them. The spacing preferably does not exceed about 0.05 meters.

The choice of the geometry of the pins or similar features that are placed in the air gap, as well as their relative spacing, is intended to provide sufficient surface area and generate sufficient turbulence in the coolant to achieve effective heat transfer. Turbulent flow is achieved by selecting a suitable combination of pin diameter and spacing according to the fluid coolant being used to achieve turbulent fluid flow. Turbulent fluid flow is achieved when the Reynolds Number is above a minimum threshold value. The Reynolds Number is a function of the coolant properties (e.g. density and viscosity) as well as a geometric length parameter: for pin fins this is the pin diameter, and coolant velocity.

The higher the Reynolds Number the better for achieving turbulence but there will be a pressure loss penalty as well. Thus, it will be understood that it is not possible to have one an optimal value for the Reynolds Number which is applicable in all geometries. In practice the inventors have found that it is necessary to work within power limits for the ventilation driver whist achieving adequate cooling. Some pin or fin geometries may be found to work better than others in certain circumstances, at the same flow. However, these benefits may need to be balanced against other design requirements. In general, the aim is to find a solution which fits these many other designs requirements, such as weight, cost, thermal performance, etc. However, as a general guide, it may be preferable to use geometries and designs which result in a Reynolds Number above 2000 to achieve turbulent flow.

Intermediate ventilation flow apertures 12, 13 are formed in a separation wall arranged between the array of TRMs and the antenna arrays they serve. The wall, and the flow apertures within it serves to control the flow of ventilation air between the volume of the housing 2 occupied by the TRM units and the antenna arrays. Apertures 12 and 13 are used to control the rate of flow to the array ie. they balance the two main flows between the TRM's and the array. The TRM's and array elements are cooled in parallel from an inlet plenum.

Figure 5A:
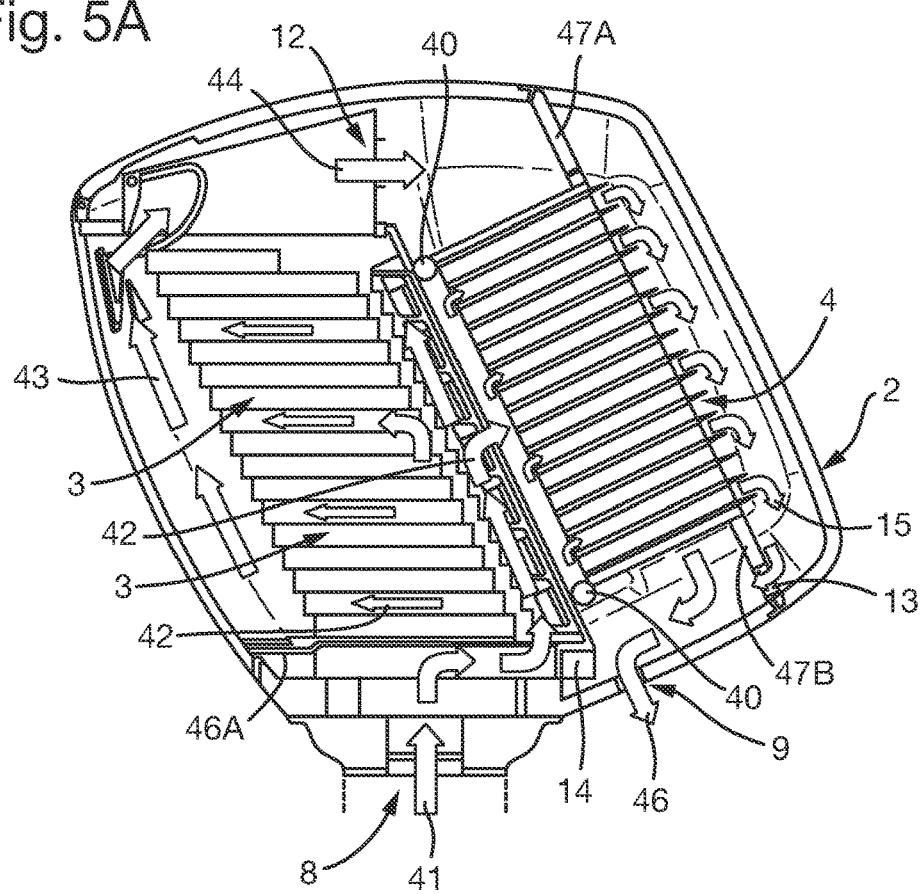
FIG. 5A shows a cross-sectional view of an antenna system according to an embodiment if the invention, in which coolant air flow paths are shown schematically.
Figure 5B:
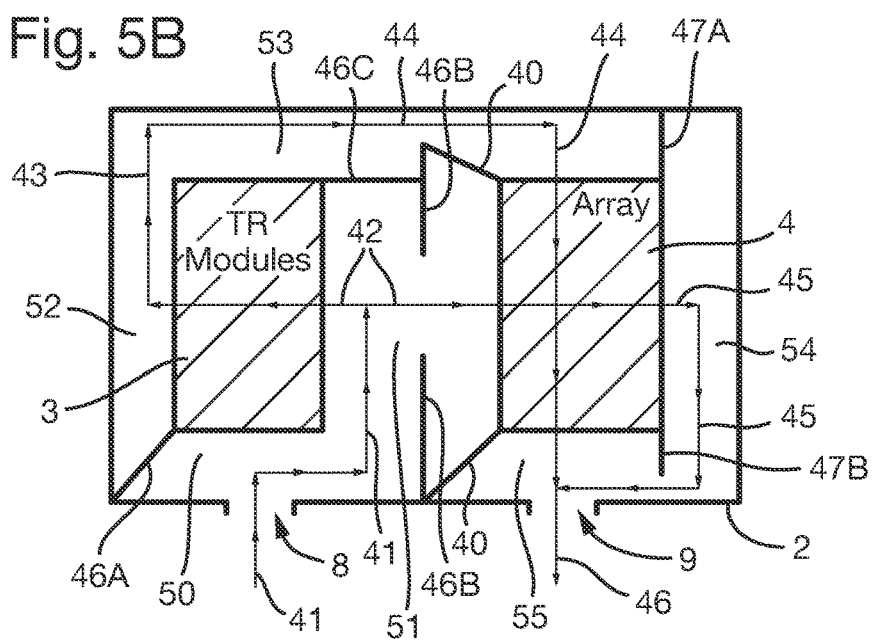
FIG. 5B shows a schematic view of the internal walls of the housing of the antenna system of FIG. 5B.

FIG. 5A shows a cross-sectional view of an antenna system according to an embodiment of the invention housed within a housing within which coolant air flow paths are shown schematically. FIG. 5B shows the housing and airflow paths schematically for clarity. The antenna system is mounted upon a mast shown in FIG. 1 with a ventilation driver 6. These parts are omitted from FIGS. 5A and 5B for clarity.

Referring to FIGS. 5A and 5B in combination, a RADAR antenna housing 2 contains a rack comprising a stack of sixteen separate antenna radiating element units 4 collectively forming an antenna array arranged adjacent to a front wall of the housing, and a rack comprising a stack of sixteen corresponding TRM units 3. Each one of the TRM units is arranged adjacent to a rear wall of the housing and is configured to transmit and receive RF transmissions to/from a respective dedicated one of the sixteen antenna radiating element units.

A ventilation inlet opening 8 provides access for ventilation air, driven by the ventilation driver (not shown), into the housing along a first ventilation duct (50, 51) formed by the outer walls of the housing in combination with internal walls of the housing (46A, 46B, 46C) which constrain the flow of air to both the stack of TRMs and the stack of antenna radiating elements, along the height of each stack within a ventilation passageway formed by the spacing between separate opposing sides of the two separated stacks within the housing.

The TRMs are stacked in a spaced array, one over the next, such that a ventilation gap is formed between opposing parallel surfaces of successive TRMs 3. In particular, the plane upper surface of one TRM unit is opposed by the lower covering surface of the next TRM above it in the stack. The same applies to successive antenna radiating element units 4, which also present flat, opposing surfaces. The opposing surfaces of separate, successive TRMs in the stack of TRMs, each present a heat exchanger plate 10, shown in plan view in FIG. 6. Each heat exchanger plate comprises a planar base plate 25 populated by a plurality of separate heat-conductive pin projections 30 which extend perpendicularly from the presented surface in a direction across the ventilation gap. The pin projections, and the ventilation gap between opposing heat exchanger plates is chosen to generate turbulence in a flow air along the ventilation gap at a flow rate determined by the ventilation driver.

Ventilation air flow 42 bifurcates and is forced through the ventilation gaps between TRMs and between the radiating antenna element units by an upper wall 46C of the first ventilation duct. A first branch of the bifurcated air flow emerges from the ventilation gaps between TRM units and flows into a second ventilation duct 52 bounded by a rear wall of the housing 2 and separated from the first ventilation duct by lower wall 46A of the first ventilation duct. Subsequent upward flow 43 of the heated ventilation air carries the air to a third, uppermost ventilation duct bounded by a top wall (roof) of the housing and separated from the first ventilation duct by the upper wall 46C thereof.

Flow guides (40, 46B) guide the second branch of the bifurcated airflow into the rack containing the stack of antenna radiating element units 4. This air passes through spacings between units within that stack and emerges 45 into a fourth ventilation duct 54 bounded by the front wall of the antenna housing 2 and the opposing side of the stack of radiating element units 4. This fourth ventilation duct is separated from the third ventilation duct by a duct end wall 47A terminating the third ventilation duct, but is in fluid communication with a final ventilation duct 55 which contains the ventilation exhaust outlet 9. A flange 47B extends into the final ventilation duct at the meeting with the fourth ventilation duct to control the rate of air from the fourth to the final duct and, thereby, the pressure of ventilation air within the housing. The lower portion of the flow guide 40 terminates the final ventilation duct and separates it from the first ventilation duct. Ventilation flow is permitted to pass over the stack of antenna radiating element units 4 from a terminal end region of the third ventilation duct 53 which places that duct in fluid communication with the antenna stack, and directs air to pass in a direction transverse to the concurrent flow of air 45 passing through the antenna stack from the first ventilation duct to the fourth ventilation duct. Ventilation air enters the final ventilation duct directly from the base of the stack of antenna elements, and also enters 45 from the fourth ventilation duct where it is output 46 from the ventilation exhaust outlet 9.

In this way, ventilation air may be passed through ventilation gaps to receive heat from heat exchangers 10 and pass around and out of the antenna housing 2.

The invention claimed is:

1. An air-cooled antenna comprising:
   one or more separate antenna arrays and a plurality of separate respective radio transmitter and/or receiver modules each adapted for generating and/or receiving radio-frequency (RF) transmissions for a said antenna array associated therewith;
   an antenna housing containing said transmitter and/or receiver modules and having a ventilation inlet for receiving air into the housing to an exhaust outlet for outputting said air from the housing; and a ventilation driver for driving an air flow rate through the housing from said ventilation inlet to said exhaust outlet; and
   a plurality of substantially planar heat exchanger plates each mounted on respective ones of the transmitter and/or receiver modules, each of the heat exchanger plates having a plurality of separate heat-conductive projections extending away from a surface of the respective heat exchanger plate,
   wherein neighbouring transmitter and/or receiver modules are arranged to present opposing surfaces of the respective heat exchanger plates across a spacing between the opposing transmitter and/or receiver modules to define a ventilation gap populated by the plurality of separate heat-conductive projections which extend in a direction across the ventilation gap from a said surface of the respective heat exchanger plate toward a surface of an opposing heat exchanger plate and which are spaced to generate turbulence in an air flow along the ventilation gap between the opposing heat exchanger plates at said flow rate determined by said ventilation driver; and
   wherein the air-cooled antenna further comprises a separation wall arranged between the transmitter and/or receiver modules and the antenna arrays, wherein the transmitter and/or receiver modules and the one or more antenna arrays are on opposite sides of the separation wall, and wherein said separation wall includes ventilation flow apertures configured to control the air flow over said heat-conductive projections.

2. The air-cooled antenna according to claim 1, wherein said spacing between said transmitter and/or receiver modules does not exceed 0.05 meters.

3. The air-cooled antenna according to claim 1, wherein said opposing respective surfaces are substantially flat and mutually parallel such that said spacing between said transmitter and/or receiver modules is substantially uniform.

4. The air-cooled antenna according to claim 1, wherein said flow rate is a volumetric flow rate which does not exceed 1 (one) cubic meters per second.

5. The air-cooled antenna according to claim 1, wherein said heat-conductive projections extend a distance not exceeding 0.05 meters in said direction across the ventilation gap from a said surface.

6. The air-cooled antenna according to claim 1, wherein neighbouring said heat-conductive projections are separated by a spacing not exceeding 0.05 meters.

7. The air-cooled antenna according to claim 1, wherein neighbouring said heat-conductive projections have a width not exceeding 0.05 meters.

8. The air-cooled antenna according to claim 1, wherein the exhaust outlet is open to the external environment to define an open loop air cooling system.

9. The air-cooled antenna according to claim 1, further comprising at least one internal wall of the housing, the at least one internal wall configured to cause an airflow entering the antenna to bifurcate into a first branch of bifurcated air and a second branch of bifurcated air, the first and second branches of bifurcated air for cooling separate antenna system components.

10. The air-cooled antenna according to claim 9, wherein the at least one internal wall is further configured to cause the first branch of bifurcated air to pass over the heat-conductive projections, through the ventilation flow apertures, and over the antenna arrays, and to cause the second branch of bifurcated air to pass over the antenna arrays in a direction transverse to a concurrent flow of the first branch of bifurcated air passing over the antenna arrays.

11. A method of air-cooling an antenna, the method comprising:
   providing one or more separate antenna arrays and a plurality of separate respective radio transmitter and/or receiver modules each adapted for generating and/or receiving radio-frequency (RF) transmissions for a said antenna array associated therewith;
   providing an antenna housing containing said transmitter and/or receiver modules and having a ventilation inlet for receiving air into the housing to an exhaust outlet for outputting said air from the housing;
   providing a plurality of substantially planar heat exchanger plates each mounted on respective ones of the transmitter and/or receiver modules, each of the heat exchanger plates having a plurality of separate heat-conductive projections extending away from a surface of the respective heat exchanger plate,
   wherein neighbouring transmitter and/or receiver modules are arranged to present opposing surfaces of the respective heat exchanger plates across a spacing between the opposing transmitter and/or receiver modules to define a ventilation gap, and wherein the ventilation gap is populated with the plurality of separate heat-conductive projections which extend in a direction across the ventilation gap from a said surface of the respective heat exchanger plate toward a surface of an opposing heat exchanger plate and which are spaced to generate turbulence in an air flow along the ventilation gap between the opposing heat exchanger plates, wherein a separation wall is arranged between the transmitter and/or receiver modules and the antenna arrays, wherein the transmitter and/or receiver modules and the one or more antenna arrays are on opposite sides of the separation wall, and wherein said separation wall includes ventilation flow apertures configured to control the air flow over said heat-conductive projections; and driving an air flow through the housing from said ventilation inlet to said exhaust outlet at a flow rate to generate turbulence in the air flow along the ventilation gap between said separate heat-conductive projections thereby to transfer heat from a said surface of the respective heat exchanger plate.

12. The method according to claim 11, wherein said flow rate is a volumetric flow rate which does not exceed 1 (one) cubic meters per second.

13. The method according to claim 11, wherein said spacing does not exceed 0.05 meters, and said opposing respective surfaces are substantially flat and mutually parallel such that said spacing is substantially uniform.

14. The method according to claim 11, wherein said heat-conductive projections extend a distance not exceeding 0.05 meters in said direction across the ventilation gap from a said surface, and said neighbouring said heat-conductive projections are separated by a spacing not exceeding 0.05 meters, and said neighbouring said heat-conductive projections have a width not exceeding 0.05 meters.

15. The method according to claim 11, wherein the exhaust outlet is open to the external environment to define an open loop air cooling system.

16. The method according to claim 11, further comprising providing at least one internal wall of the housing, the at least one internal wall configured to cause an airflow entering the antenna to bifurcate into a first branch of bifurcated air and a second branch of bifurcated air, the first and second branches of bifurcated air for cooling separate antenna system components.

17. The method according to claim 16, wherein the at least one internal wall is further configured to cause the first branch of bifurcated air to pass over the heat-conductive projections, through the ventilation flow apertures, and over the antenna arrays, and to cause the second branch of bifurcated air to pass over the antenna arrays in a direction transverse to a concurrent flow of the first branch of bifurcated air passing over the antenna arrays.

* * * * *